(12) United States Patent
Sutardja et al.

(10) Patent No.: US 7,745,809 B1
(45) Date of Patent: Jun. 29, 2010

(54) ULTRA HIGH DENSITY PHASE CHANGE MEMORY HAVING IMPROVED EMITTER CONTACTS, IMPROVED GST CELL RELIABILITY AND HIGHLY MATCHED UHD GST CELLS USING COLUMN MIRCO-TRENCH STRIPS

(75) Inventors: Pantas Sutardja, Los Gatos, CA (US); Albert Wu, Palo Alto, CA (US); Chien-Chuan Wei, Sunnyvale, CA (US); Runzi Chang, Santa Clara, CA (US); Winston Lee, Palo Alto, CA (US); Peter Lee, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 105 days.

(21) Appl. No.: 12/062,444

(22) Filed: Apr. 3, 2008

Related U.S. Application Data

(60) Provisional application No. 60/909,870, filed on Apr. 3, 2007, provisional application No. 60/909,849, filed on Apr. 3, 2007, provisional application No. 60/909,844, filed on Apr. 3, 2007.

(51) Int. Cl.
 *H01L 29/04* (2006.01)
(52) U.S. Cl. .............................. 257/3; 257/4; 257/734; 257/E31.029; 438/23; 438/131; 438/776
(58) Field of Classification Search ................ 257/2–5, 257/184, 194, 200, 203, 400, 421, 530, 734, 257/E31.029; 438/23, 131, 776; 365/145, 365/148, 175
See application file for complete search history.

(56) References Cited

U.S. PATENT DOCUMENTS

| | | | |
|---|---|---|---|
| 7,422,926 B2 * | 9/2008 | Pellizzer et al. | 438/95 |
| 2005/0006681 A1 * | 1/2005 | Okuno | 257/295 |
| 2005/0024933 A1 * | 2/2005 | Pellizzer et al. | 365/163 |
| 2006/0034116 A1 * | 2/2006 | Lam et al. | 365/151 |

* cited by examiner

*Primary Examiner*—Evan Pert
*Assistant Examiner*—Scott R Wilson

(57) ABSTRACT

Embodiments of the present invention provide an apparatus comprising a substrate comprising an emitter layer and at least one emitter interface adjacent to the emitter layer, and a metal protective layer on a top surface of the at least one emitter interface. A method of manufacturing such an apparatus is also disclosed. The method may include performing plasma nitridation directed at column micro-trench strips. Other embodiments are also described.

19 Claims, 10 Drawing Sheets

_US 7,745,809 B1_

ULTRA HIGH DENSITY PHASE CHANGE MEMORY HAVING IMPROVED EMITTER CONTACTS, IMPROVED GST CELL RELIABILITY AND HIGHLY MATCHED UHD GST CELLS USING COLUMN MIRCO-TRENCH STRIPS

CROSS REFERENCE TO RELATED APPLICATIONS

The present application claims priority to U.S. Patent Application No. 60/909,870, filed Apr. 3, 2007, entitled "UHD PCM Processing Steps," U.S. Patent Application No. 60/909,844, filed Apr. 3, 2007, entitled "Method to Improve GST Cell Reliability by Using Plasma Nitridation Before GST Deposition," and U.S. Patent Application No. 60/909,849, filed Apr. 3, 2007, entitled "Method to Create Highly Matched UHD Gst Cells Using Column Micro-Trench Strips," the entire specifications of which are hereby incorporated by reference in their entirety for all purposes, except for those sections, if any, that are inconsistent with this specification.

TECHNICAL FIELD

Embodiments of the present invention relate to the field of electronic memory devices, and more particularly, to phase change material (PCM) memory devices and methods for fabricating thereof.

BACKGROUND

Memory cells of electronic memory devices such as dynamic random access memory typically employ a number of electronic components in order to save data. For instance, in order to store data, a combination of electronic components such as transistors, diodes, and/or capacitors are typically employed in such memory cells to store or not store electrical charges. If a charge is stored in such a memory cell, that may indicate a logic "1," and if no charge is stored in such a memory cell that may indicate a logic "0."

An alternative approach for storing data is to use memory cells made of phase change material (PCM). A PCM is a material that can be placed into at least two physical states, a crystalline state and an amorphous state, by increasing or decreasing temperature. By changing the physical state of the PCM material, certain characteristics of the material, such as electrical resistance, may also change. Such properties may be exploited in order to form memory cells made of PCM (herein "PCM cells").

Such memory cells are generally intricate and expensive to manufacture. Thus, it is important to manufacture them in such a way to ensure accuracy and reliability such that few memory cells are wasted.

SUMMARY

In accordance with various embodiments of the present invention, a method includes forming a substrate comprising an emitter layer and at least one emitter interface adjacent to the emitter layer, and performing a metallization such that an emitter interface metal protective layer is provided on the at least one emitter interface.

In accordance with various embodiments, the substrate further comprises a base layer and at least one base interface adjacent to the base layer. The metallization is performed such that the at least one base interface includes a base interface metal protective layer thereon. Further embodiments also include the substrate further comprising a peripheral device layer and at least one peripheral device interface adjacent to the peripheral device layer. The metallization is performed such that the peripheral device interface includes a peripheral device metal protective layer thereon.

In accordance with various embodiments, the metallization is performed with tungsten.

In accordance with various embodiments, the method further includes performing silicidation prior to performing the metallization.

In accordance with various embodiments, the method further includes forming, within a dielectric layer, a heater element on the emitter interface metal protective layer of the one emitter interface. In accordance with such embodiments, the heater element may comprise one of titanium nitride (TiN) or tantalum nitride (TaN).

In accordance with various embodiments, the method further includes forming a heater element contact on the heater element. In such embodiments, forming the heater element contact on the heater element may comprise depositing an oxide layer on the dielectric layer and performing a lithograph/etch process to create column micro-trench strips within the oxide layer.

In accordance with various embodiments, the method further comprises performing plasma nitridation directed at the column micro-trench strips.

In accordance with various embodiments, the method further includes depositing GST material on the oxide layer, depositing a top electrode material on the GST material and performing a lithograph/etch process to create GST columns.

In accordance with various embodiments, the method further includes forming, for each at least one emitter interface, a top emitter interface on the GST columns.

In accordance with various embodiments, the method further includes performing a second metallization such that a metal protective layer is provided on the at least one top emitter interface. In accordance with such embodiments, the second metallization may be performed with tungsten.

The present invention also provides an apparatus including a substrate comprising an emitter layer and at least one emitter interface adjacent to the emitter layer, and an emitter interface metal protective layer on the at least one emitter interface.

In accordance with various embodiments, the substrate further comprises a base layer and at least one base interface adjacent the base layer, wherein the base interface includes a base interface metal protective layer thereon.

In accordance with various embodiments, the substrate further comprises a peripheral device layer and at least one peripheral device interface adjacent to the peripheral device layer, wherein the peripheral device interface includes a peripheral device metal protective layer thereon.

In accordance with various embodiments, the emitter interface metal protective layer comprises tungsten.

In accordance with various embodiments, the apparatus further includes a heater element on the emitter interface metal protective layer of the at least one emitter interface. In accordance with such embodiments, the heater element may comprise one of TiN or TaN.

In accordance with various embodiments, the apparatus may further include a heater element contact on the heater element. In accordance with such embodiments, the heater element contact may be formed by depositing an oxide layer on a dielectric layer of the apparatus and performing a lithograph/etch process to create column micro-trench strips within the oxide layer.

In accordance with various embodiments, a plasma nitridation may be directed at the column micro-trench strips such that the column micro-trench strips are defined by walls comprising nitrided oxide.

In accordance with various embodiments, the apparatus further includes GST columns within the column micro-trench strips. In accordance with such embodiments, a top emitter interface may be included on the GST columns for each at least one emitter interface.

In accordance with various embodiments, the apparatus further comprises a top metal protective layer on a top surface of each at least one top emitter interface. In accordance with such embodiments, the top metal protective layer may comprise tungsten.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments of the present invention provide an ultra high density (UHD) phase change memory (PCM) apparatus and methods for fabricating the same.

Figure 1:
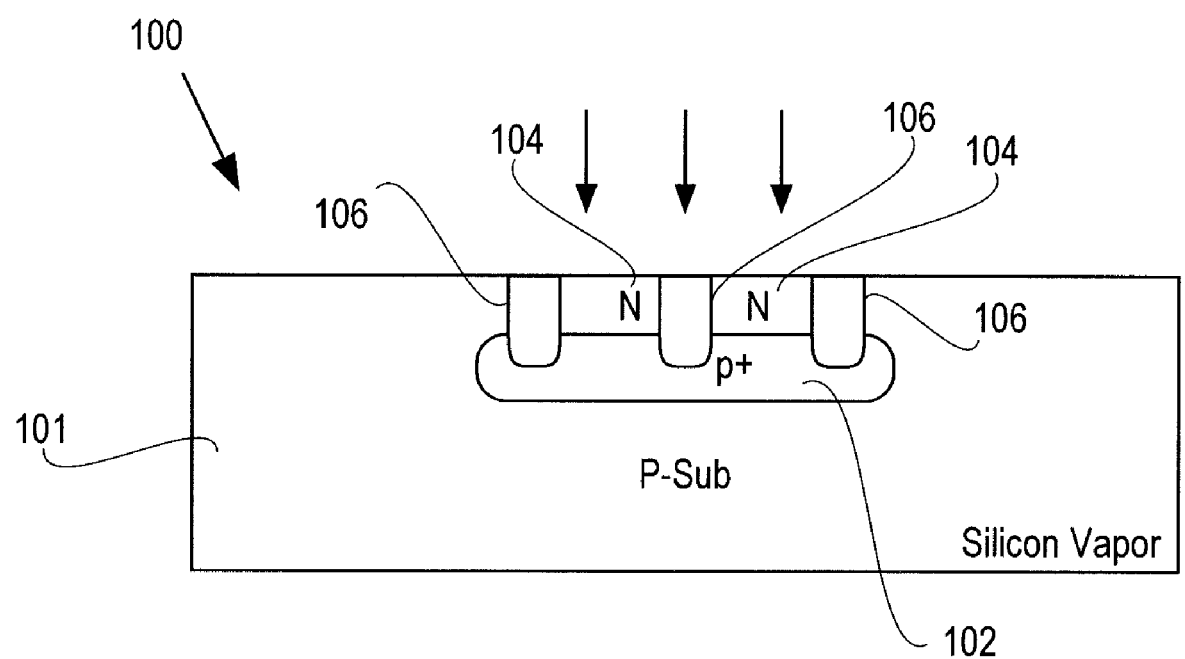
FIGS. 1-3 are cross sectional schematic views of a substrate after various operations, in accordance with various embodiments of the present invention.

Referring to FIG. 1, a memory cell area 100 may be formed beginning with a memory cell area lithograph operation (Clear Tone Mask) that is performed on a silicon vapor substrate 101. A collector doping operation is performed to create a P+ collector region 102, followed by a base doping operation to create an N base region 104. Next, a shallow trench isolation (STI) lithographic operation is performed including etching and filling trenches 106 with oxide. This completes the memory cell area 100 and thus, a chemical mechanical planarization (CMP) operation may be performed to smooth the various areas of the substrate 101.

Figure 2:
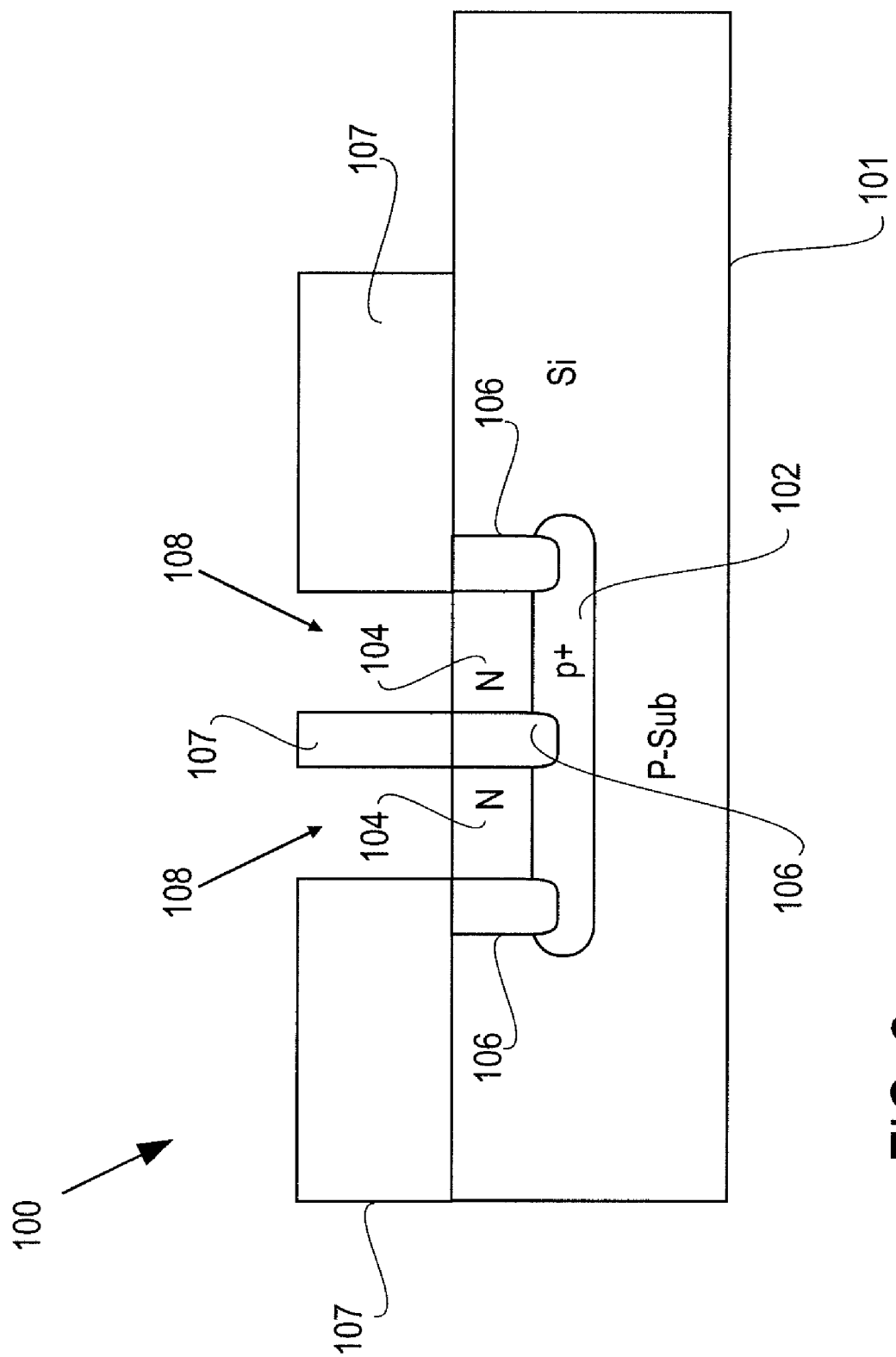
Figure 3:
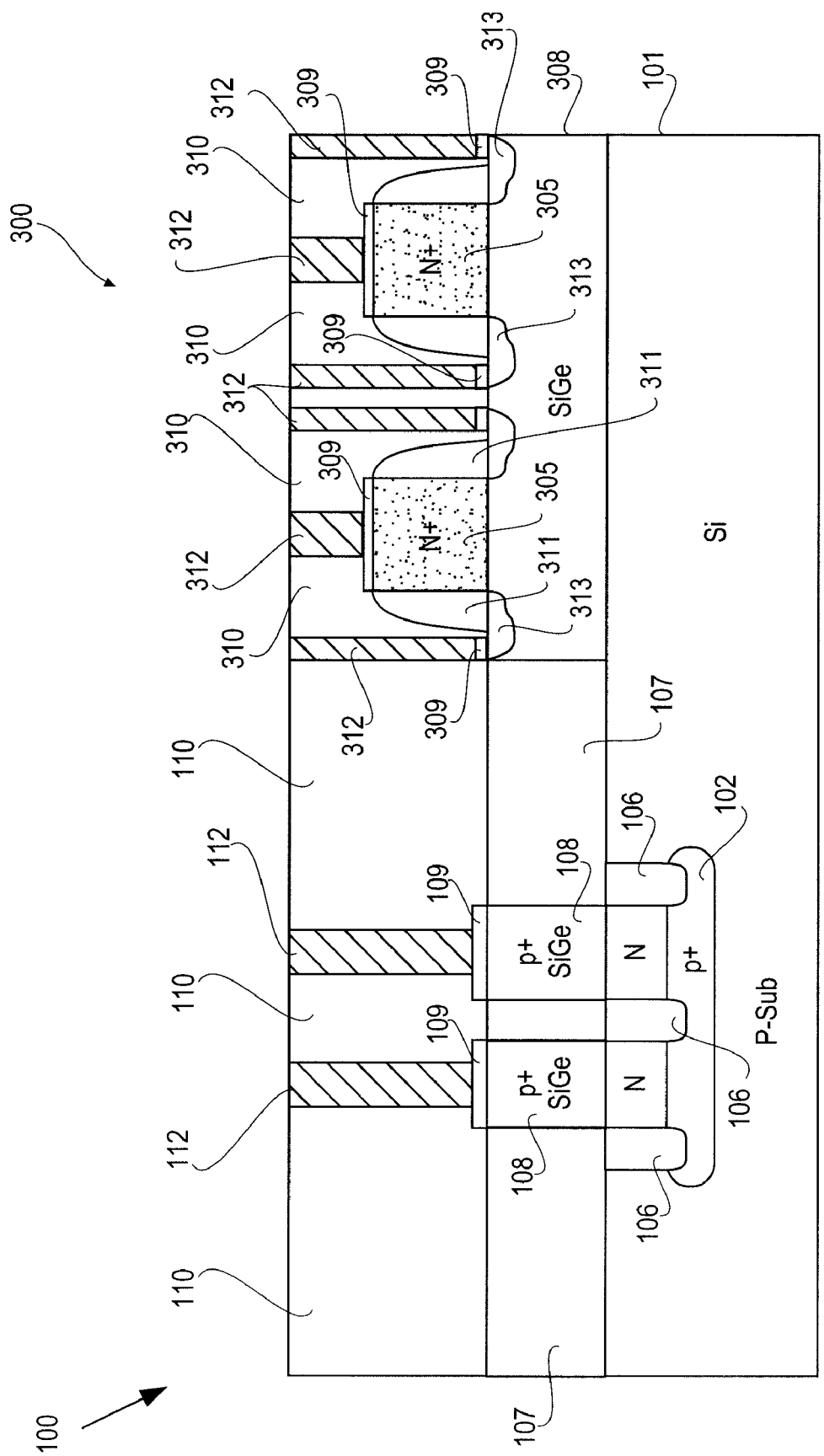

Referring to FIGS. 2 and 3, an interlayer dielectric deposition may then be performed, followed by an emitter lithographic formation. The area may be etched in order to open the emitter areas 108 and peripheral device area 300. Peripheral device area 300 may serve as, for example, an interface for the memory cell area 100. High temperature silicon germanium (SiGe) is Epi (epitaxial) formed in the emitter area in order to fill up the emitter opening with P+ SiGe. If needed, a CMP operation may be performed to smooth the surface.

A base lithographic operation may then be performed for memory area opening and ion metal plasma (IMP) is provided to the base 104. It is desirable to insure that the IMP N+ covers the base pick-up. This may be followed by another emitter lithographic operation and IMP to the emitters 108. This is done to help ensure that the base 104 and emitter areas 108 maintain the proper level of doping after the SiGe Epi formation.

The CMOS process is then completed in the peripheral device area 300 on top of the SiGe region 308, as is known in the art. This results in gates 305, spacers 311 and bases 313.

In accordance with various embodiments of the present invention, a silicidation is performed in order to deposit silicide at regions 109 and 309. The silicidation may include depositing a layer of, for example, nickel or cobalt. The layer is then etched resulting in regions 109 and 309. This is followed by another ILD deposition.

A contact lithograph operation and etching are then performed on the emitter pick-ups, base pick-up and the collector pick-up, as well as the peripheral region 300 to form ILD regions 110 and 310. In accordance with various embodiments, this is followed by a Tungsten metallization and, if desired, another CMP operation. The Tungsten metallization allows for the Epi grown silicided, SiGe emitters 108 to include a Tungsten emitter interface protective layer 112 on a silicided top surface 109 that may serve as the emitter interface. Likewise, the peripheral device region 300 includes Tungsten peripheral device protective layers 312 on the silicided top surfaces 309 of the gates 305 and the bases 313.

Figure 4:
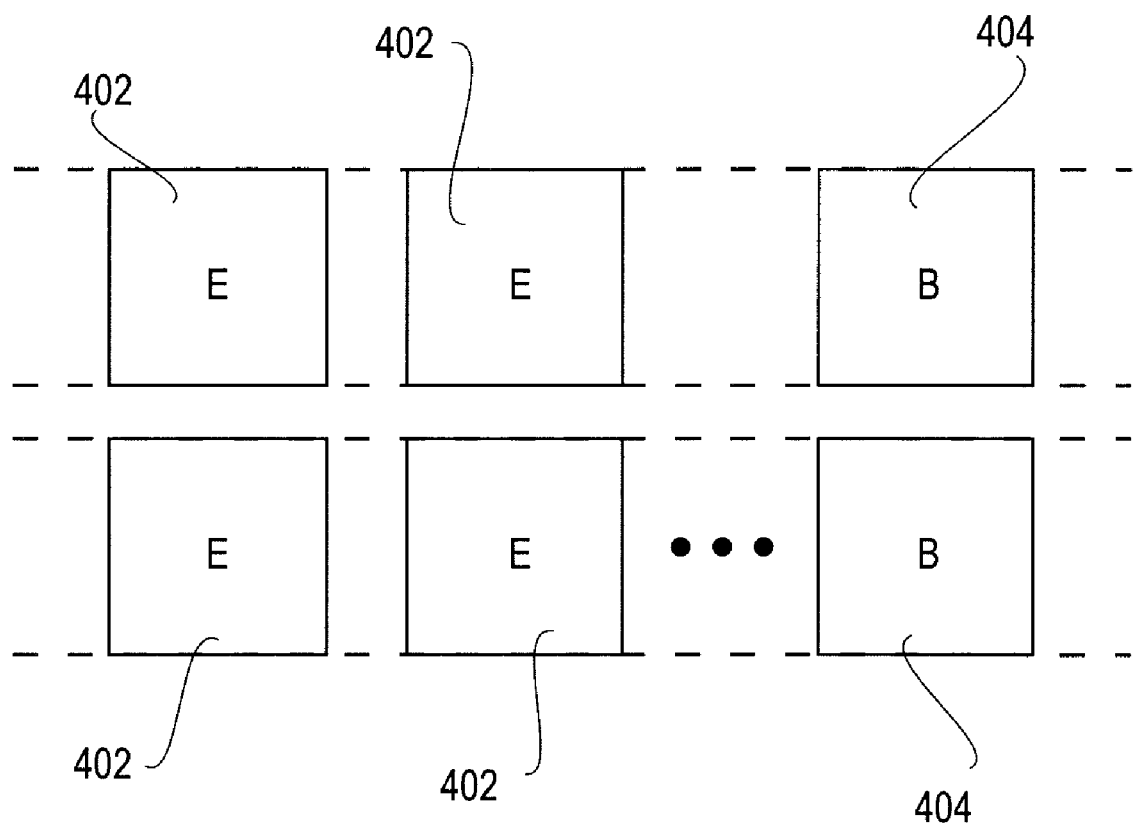
FIG. 4 is a top schematic view of a substrate after various operations, in accordance with various embodiments of the present invention.
Figure 5A:
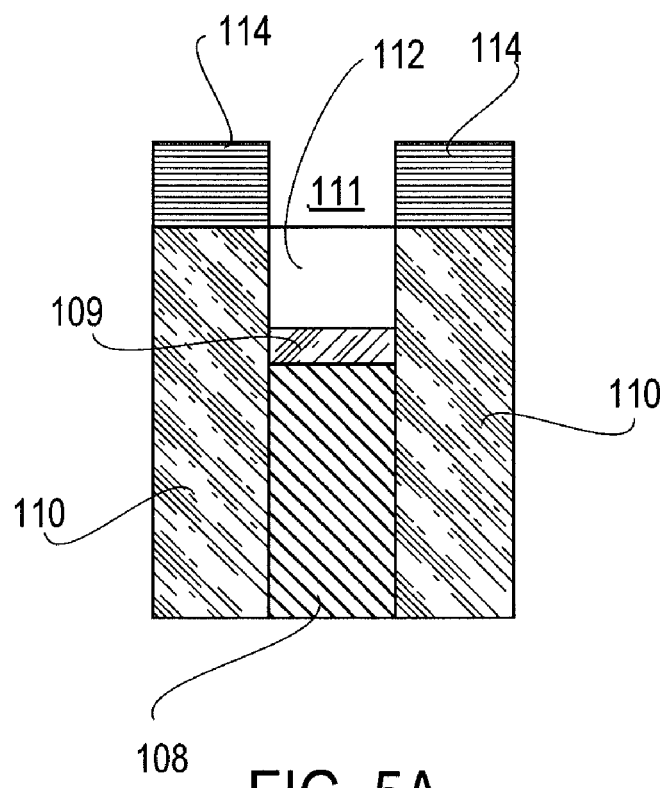
FIGS. 5-10 are cross sectional schematic views of a substrate after various operations, in accordance with various embodiments of the present invention.
Figure 5B:
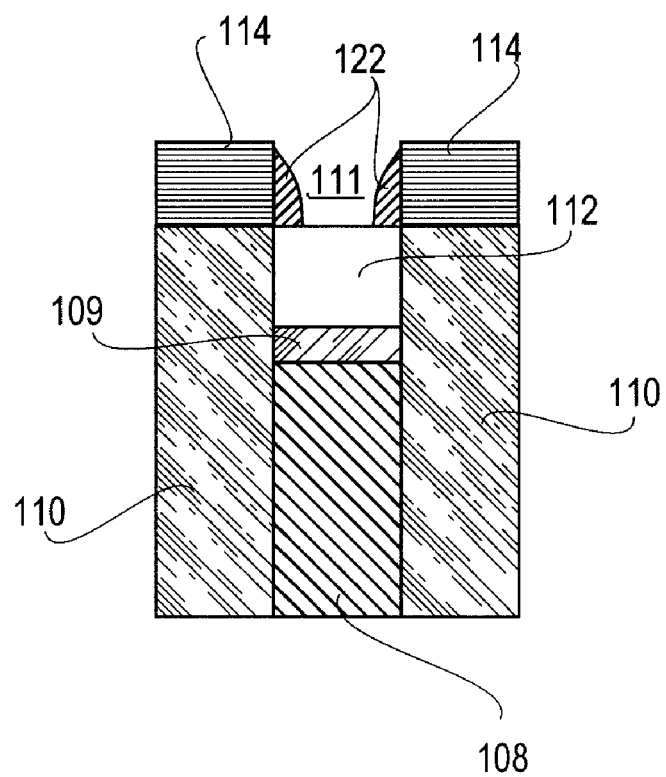
Figure 6A:
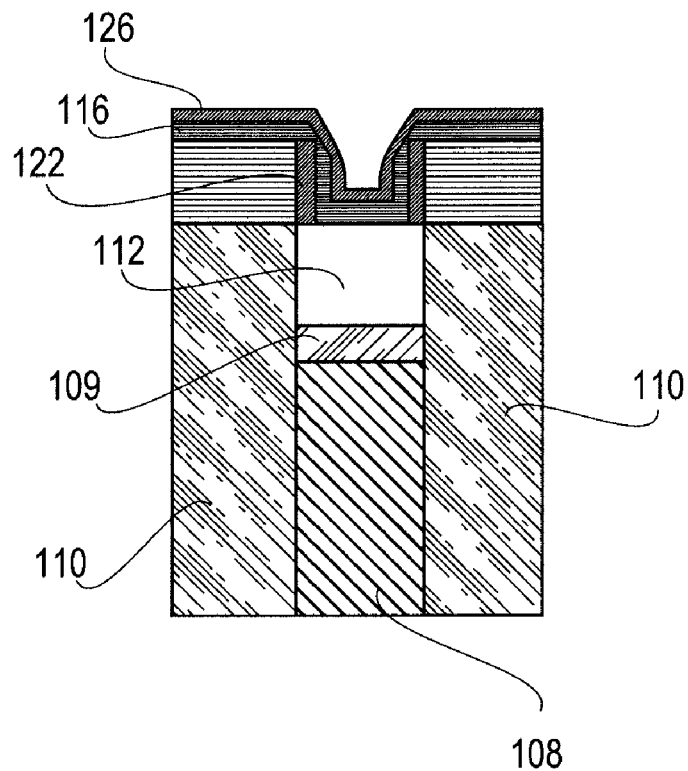
Figure 6B:
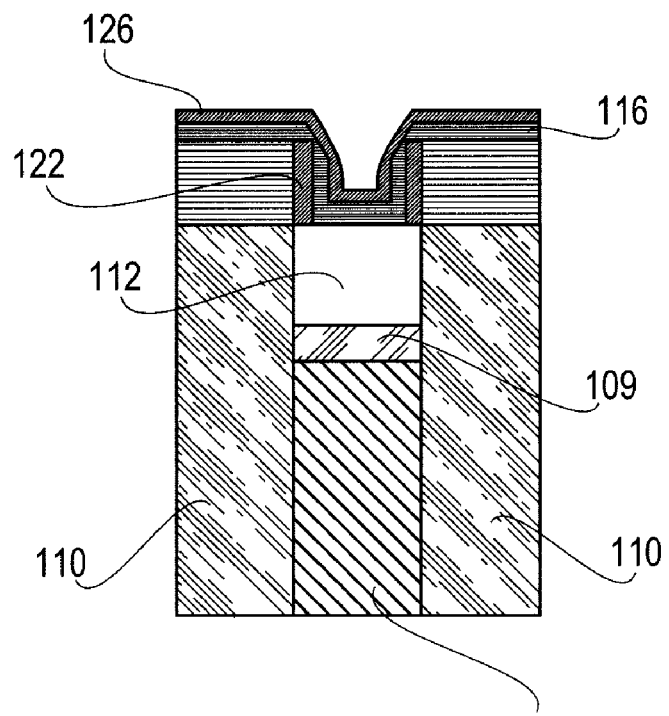
Figure 7A:
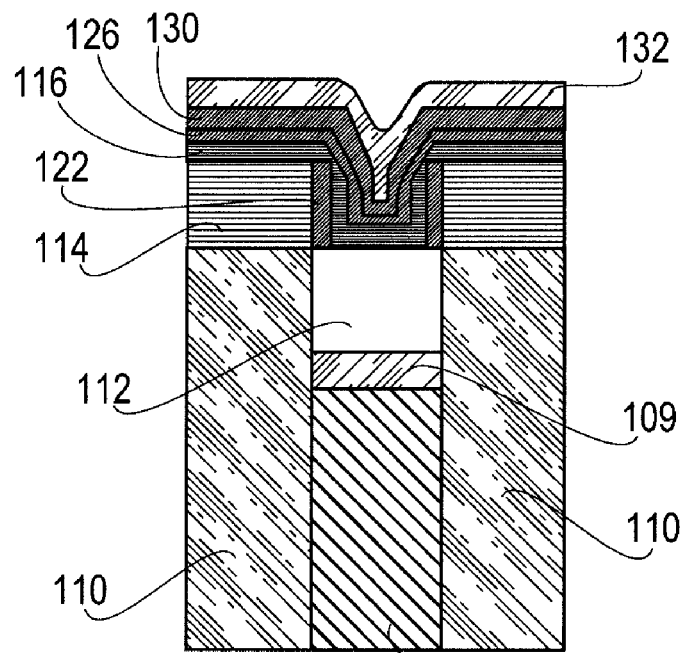
Figure 7B:
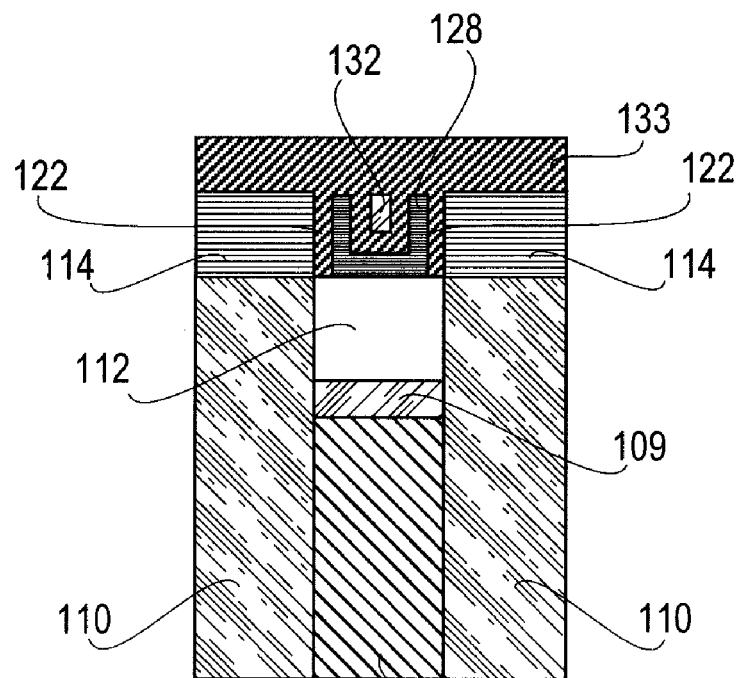

Referring to FIG. 4, a top view of a wafer 400 including multiple memory cell areas 100 as described above is illustrated. As is known in the art, each emitter 108 for each memory cell area 100 has an emitter pick-up (interface) 402 and each base 104 includes a base pick-up (interface) 404. A base protective metal, for example Tungsten, layer may be included on the base pick-up 404.

Referring to FIGS. 5A, 5B, 6A, 6B, 7A and 7B, in accordance with various embodiments, heater elements 128 are formed on the emitters 108. After formation of the emitters 108 with the protective Tungsten layers 112, an oxide layer 114 is deposited. A column trench lithograph operation is performed to create trench 111. The column trench 111 is etched, stopping at the Tungsten surface 112 of the emitter layer 108. A thin layer of silicon nitride ($Si_3N_4$) may then be deposited. An anisotropic etch of the $Si_3N_4$ layer is then performed in order to remove a portion of the $Si_3N_4$ layer, but preserve the side wall $Si_3N_4$ in the heater trench 111 in order to provide a heater seal 122. In an alternative embodiment, if the silicided emitter cannot be protected during this etching process, then this step may be skipped.

A heater alloy, for example, titanium nitride (TiN) or tantalum nitride (TaN) may then be deposited as layer 116 that will be formed into the heater elements 128. A thin layer 126 of $Si_3N_4$ is then deposited over the heater alloy layer 116 in order to provide a second heater seal. This layer 126 may not be needed if there is not a contamination issue with photo resist of the heater alloy surface layer and thus, may be eliminated if desired. In such an embodiment, a subsequent layer 130 of $Si_3N_4$ described further herein may provide sufficient sealing.

A row cut lithograph operation is then performed for the heater elements 128. Isotropic etching of the $Si_3N_4$ layer 126 may then be performed. A thin layer 130 of $Si_3N_4$ is then conformally deposited. This may serve as a further heater seal layer 130. A layer 132 of oxide is then deposited in order to fill up the trenches 111 in both the column (heater) and row (cut) directions. A CMP operation may be performed in order to remove oxide until $Si_3N_4$ layers 126 and 130 are exposed. This CMP operation is followed by a subsequent CMP process in order to remove $Si_3N_4$ layers 126 and 130 until the heater alloy layer 116 is exposed. Finally, another CMP operation may be performed in order to remove TiN until the $Si_3N_4$ heater seal 122 is exposed.

In accordance with various embodiments, at this point, the germanium antimony tilarium (GST) portion is formed. This process may begin by depositing an approximately 40 nm thick layer 133 of $Si_3N_4$, thereby covering heater element 128, heater seal 122 and the small remaining portion of oxide layer 132.

Figure 8A:
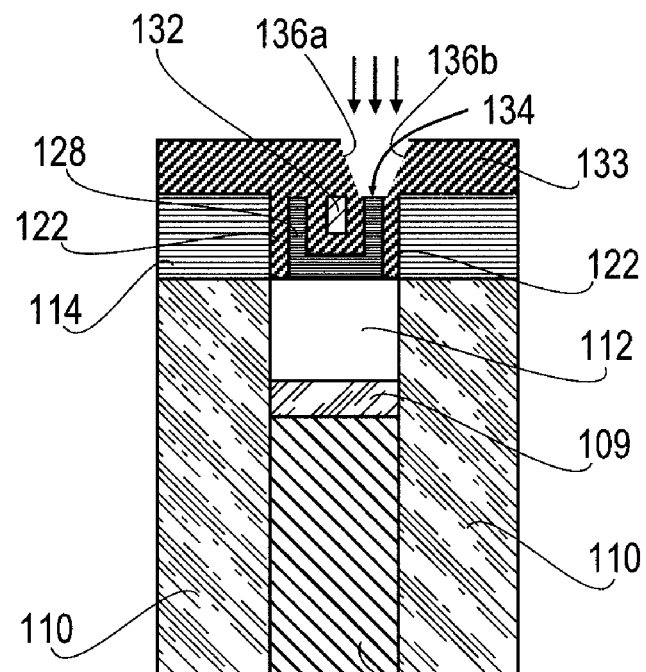
Figure 8B:
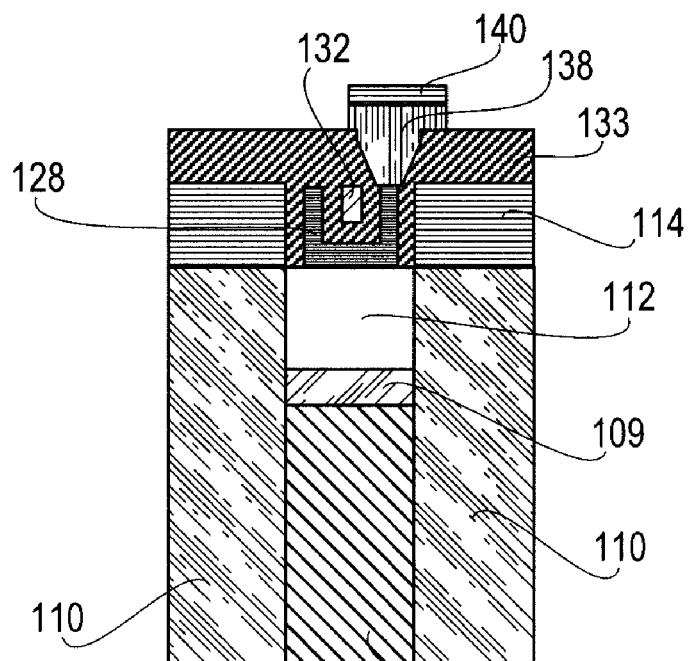

Referring to FIGS. 8A and 8B, a lithograph/etching of the $Si_3N_4$ layer 133 in the column direction is then performed in order to expose one side of the heater element 128, an offset column, at 134, for contact with GST material 138. In accordance with the various embodiments, the etching is performed in order to create a reasonable slope on the sides of the trenches 136a, 136b of approximately 30 to 40 degrees relative to a vertical line. GST material 138 may then be deposited within the trenches. If the surface of the GST material 138 is not flat, a CMP operation may be performed. A top electrode 140 is then deposited for the GST material. Examples of material that may be used to form the top electrode 140 include Ti, Ta, TiN and TaN. A lithograph and etching operation is performed for the GST material 138 and top electrode 140 within the trenches.

In accordance with various embodiments, prior to deposition of the GST material 138 a plasma nitridation is performed to turn the surface of oxide portion 132 to silicon nitride. Since nitride and the GST interface have a higher activation energy than that of oxide and GST, the reliability of the GST device may be enhanced. Also, the increased contact resistance between the heater element 128 and the GST material 138 (due to nitridation on the heater element 128) may bring the thermal generation more closely to that of the memory cell and hence, the thermal efficiency may be increased as well.

Figure 10:
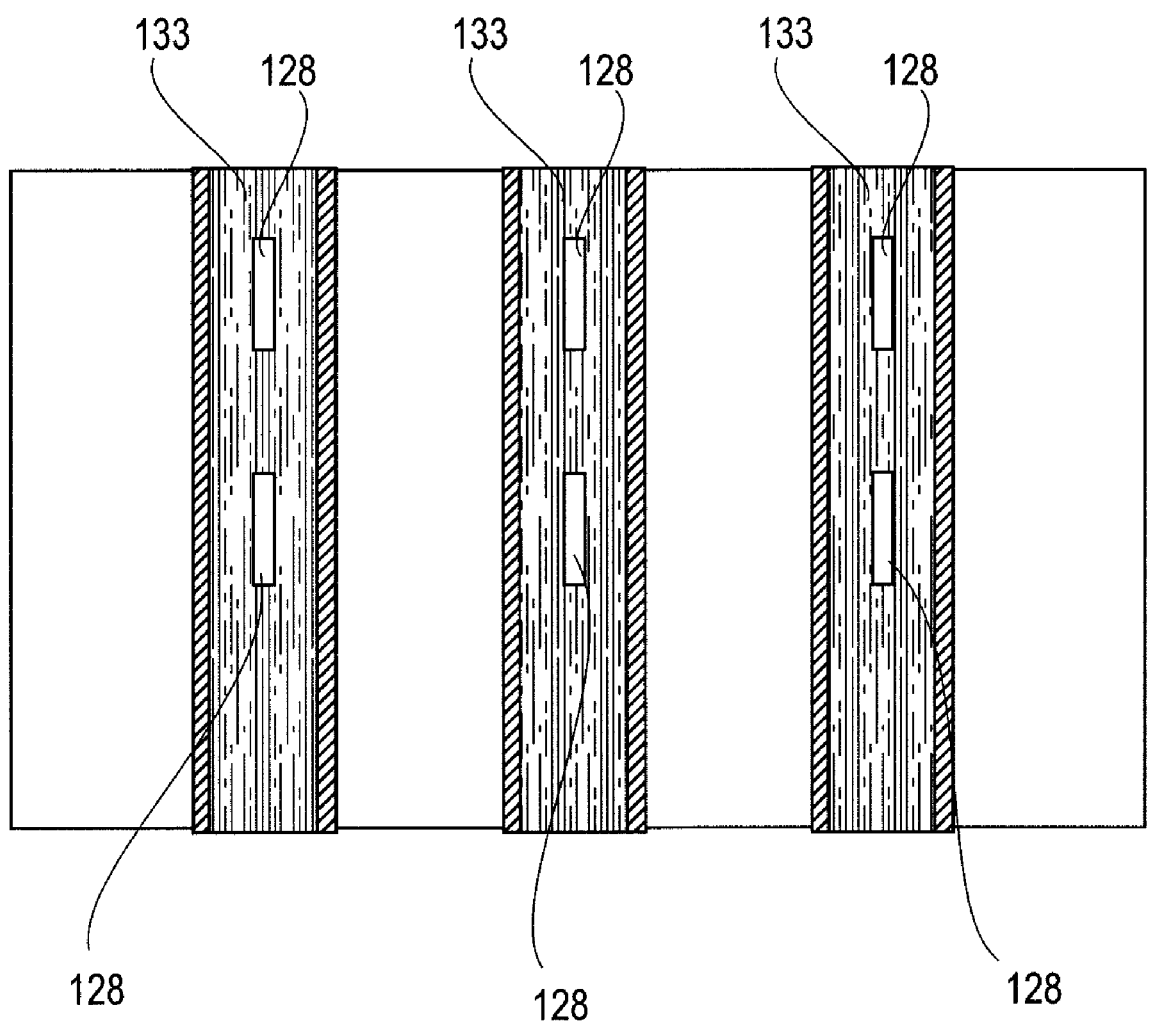

Referring to FIG. 10, in accordance with various embodiments of the present invention, the lithograph/etching of the $Si_3N_4$ layer 133 in the column direction in order to expose one side of the heater element 128 is performed in strips, as opposed to the previous squared individual micro-trenches. This results in parallel gratings exposing heater element 128 in the $Si_3N_4$ layer 133. The parallel gratings may improve the process stability and increase the process window. As a result, the final GST device may be more immune to alignment and process variations and the devices may be highly matched.

Figure 9A:
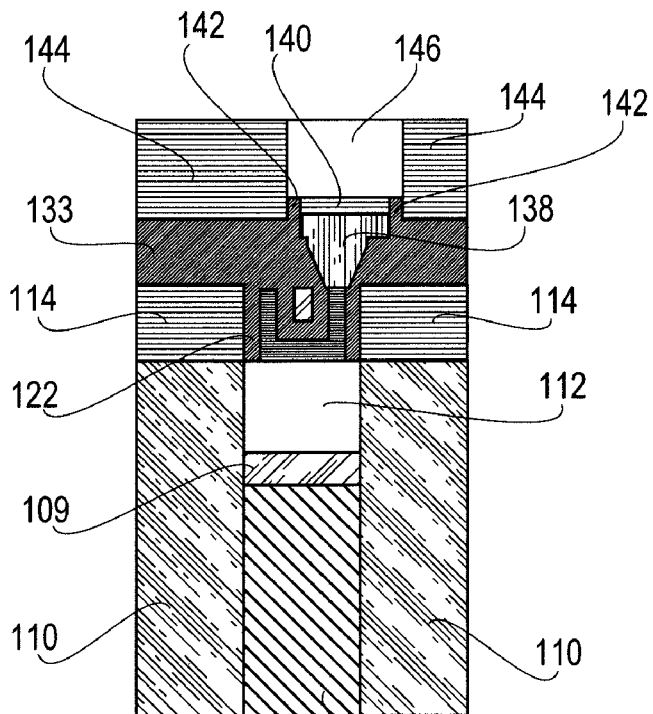
Figure 9B:
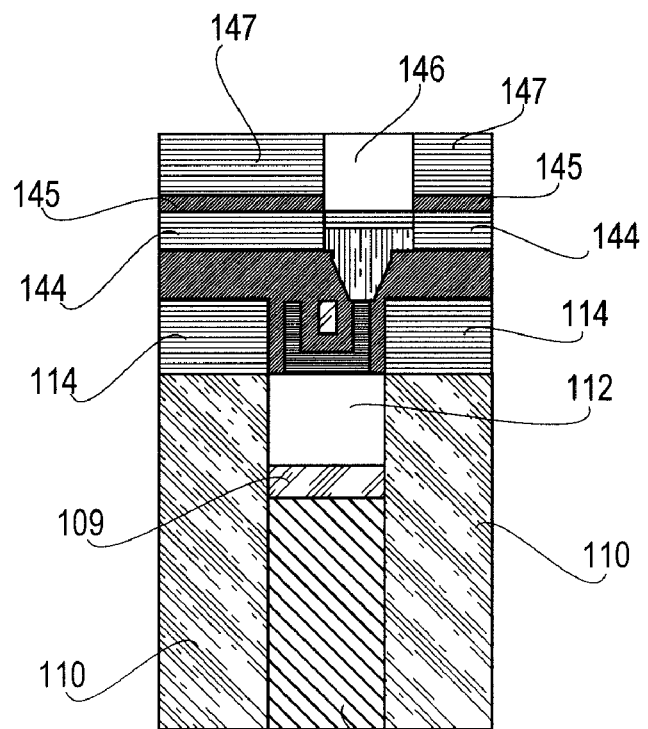

Referring to FIGS. 9A and 9B, in accordance with the various embodiments, a thin layer of $Si_3N_4$ is deposited and then etched in order to provide a GST seal 142. A deposition of oxide 144 is provided in order to provide over-GST dielectric. If the surface of oxide 144 is not as flat as desired, a CMP operation may be performed.

In accordance with alternative embodiments, instead of the deposition of oxide 144 and the subsequent CMP, a deposition of oxide may be performed and then a CMP may be performed in order to remove the top oxide 144, A nitride seal 145 may then be deposited and oxide 147 may then be deposited in order to cover the surface again.

A lithographic and etching operation is performed in order to provide the top emitter interfaces. In accordance with various embodiments, the top emitter interfaces are formed from Tungsten 146.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
    forming a substrate, the substrate comprising an emitter layer and at least one emitter interface adjacent to the emitter layer;
    performing a metallization such that an emitter interface metal protective layer is provided on the at least one emitter interface;
    forming, within a dielectric layer, a heater element on the emitter interface metal protective layer of the at least one emitter interface;
    forming a heater element contact on the heater element by depositing an oxide layer on the dielectric layer and performing a lithograph/etch process to create column micro-trench strips within the oxide layer; and
    performing plasma nitridation directed at the column micro-trench strips.

2. The method of claim 1, wherein the substrate further comprises a base layer and at least one base interface adjacent to the base layer, and wherein the metallization is performed such that at least one base interface includes a base interface metal protective layer thereon.

3. The method of claim 2, wherein the substrate further comprises a peripheral device layer and at least one peripheral device interface adjacent to the peripheral device layer, and wherein the metallization is performed such that at least one peripheral device interface includes a peripheral device interface metal protective layer thereon.

4. The method of claim 1, wherein the metallization is performed with tungsten.

5. The method of claim 1, further comprising performing silicidation prior to performing the metallization to form the at least one emitter interface.

6. The method of claim 1, wherein the heater element comprises one of TiN or TaN.

7. The method of claim 1, further comprising depositing GST material on the oxide layer, depositing a top electrode material on the GST material and performing a lithograph/etch process to create GST columns.

8. The method of claim 7, further comprising forming, for each at least one emitter interface, a top emitter interface on the GST columns.

9. The method of claim 8, further comprising performing a second metallization such that a top emitter interface metal protective layer is provided on the at least one top emitter interface.

10. The method of claim 9, wherein the second metallization is performed with tungsten.

11. An apparatus comprising:
 a substrate comprising an emitter layer and at least one emitter interface adjacent to the emitter layer;
 an emitter interface metal protective layer on the at least one emitter interface;
 a heater element on the emitter interface metal protective layer of the at least one emitter interface; and
 a heater element contact on the heater element,
 wherein the heater element contact is formed by depositing an oxide layer on a dielectric layer and performing a lithograph/etch process to create column micro-trench strips within the oxide layer, and
 wherein a plasma nitridation is directed at the column micro-trench strips such that the column micro-trench strips are defined by walls comprising nitrided oxide.

12. The apparatus of claim 11, wherein the substrate further comprises a base layer and at least one base interface adjacent to the base layer, and wherein at least one base interface includes a base interface metal protective layer thereon.

13. The apparatus of claim 12, wherein the substrate further comprises a peripheral device layer and at least one peripheral device interface adjacent to the peripheral device layer, and wherein the peripheral device interface includes a peripheral device interface metal protective layer thereon.

14. The apparatus of claim 11, wherein the emitter interface metal protective layer comprises tungsten.

15. The apparatus of claim 11, wherein the heater element comprises one of TiN or TaN.

16. The apparatus of claim 11, further comprising GST columns within the column micro-trench strips.

17. The apparatus of claim 16, further comprising a top emitter interface on the GST columns for the at least one emitter.

18. The apparatus of claim 17, further comprising a top metal protective layer on the at least one top emitter interface.

19. The apparatus of claim 18, wherein the top metal protective layer comprises tungsten.

* * * * *